Figure 1:
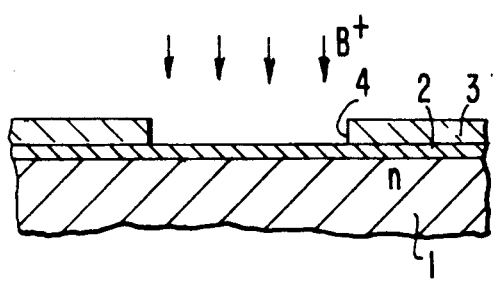
Figure 4:
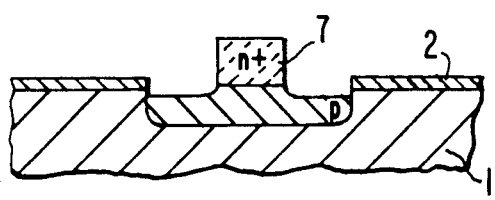

United States Patent [19]

Scovell et al.

[11] Patent Number: 5,055,419
[45] Date of Patent: Oct. 8, 1991

[54] METHOD OF MANUFACTURING A BIPOLAR TRANSISTOR

[75] Inventors: Peter D. Scovell, Chelmsford; Peter F. Blomley, Bishops Stortford; Roger L. Baker, Chelmsford; Gary J. Tomkins, Maidstone, all of Great Britain

[73] Assignee: STC, plc, London, England

[21] Appl. No.: 194,912

[22] Filed: May 17, 1988

Related U.S. Application Data

[62] Division of Ser. No. 71,474, Jul. 9, 1987, abandoned, which is a division of Ser. No. 831,257, Feb. 20, 1986, Pat. No. 4,745,080.

[30] Foreign Application Priority Data

Mar. 23, 1985 [GB] United Kingdom ................. 8507602

[51] Int. Cl.$^5$ .................... H01L 21/26; H01L 21/225
[52] U.S. Cl. ...................................... 437/31; 437/158;
   437/909; 437/979; 437/984; 148/DIG. 10;
   148/DIG. 11; 148/DIG. 124
[58] Field of Search ................. 437/162, 968, 983, 31,
   437/158, 979, 984, 909; 148/DIG. 124, DIG.
   10, DIG. 11

[56] References Cited

U.S. PATENT DOCUMENTS

| 4,188,707 | 2/1980 | Asano et al. | 148/DIG. 124 |
| 4,377,903 | 3/1983 | Kanzaki et al. | 437/162 |
| 4,407,059 | 10/1983 | Sasaki | 437/968 |
| 4,745,080 | 5/1988 | Scovell et al. | 437/31 |

FOREIGN PATENT DOCUMENTS 0108361  6/1984  Japan ................................. 437/983

OTHER PUBLICATIONS

Cuthbertson et al., "Self-Aligned Transistors with Polysilicon Emitters for Bipolar VLSI", IEEE, vol. ED 32, No. 2, 2/85, pp. 242–247.

Primary Examiner—Brian E. Hearn
Assistant Examiner—Tuan Nguyen
Attorney, Agent, or Firm—Kerkam, Stowell, Kondracki & Clarke

[57] ABSTRACT

A fully self-aligned polycrystalline silicon emitter bipolar transistor. Self-alignment of the p+ base contact (12) is achieved by using oxidized sidewalls (8) (sidewall spacers) of the emitter mesa (7) as part of the p+ base contact implantation mask. Collector contact (13) alignment can be achieved using oxidized sidewalls (17) of polycrystalline silicon alignment mesas (14) defined in the same polysilicon as the emitter mesa (7) but deposited on oxide (2) rather than the implanted base region (5).

5 Claims, 1 Drawing Sheet

METHOD OF MANUFACTURING A BIPOLAR TRANSISTOR

This application is a division of Ser. No. 07/071,474, filed 7/8/87, now abandoned, which was a division of Ser. No. 06/831,257, filed 2/20/86, now U.S. Pat. No. 4,745,080.

This invention relates to semiconductor devices and in particular bipolar transistors with polycrystalline silicon emitters, and methods of manufacturing them.

The use of polycrystalline silicon emitter offers improved performance for bipolar transistors. Severall methods of self-aligning this type of device have been published, for example Tang D., IEE JSSC SC17 1983 p. 226 and Sakai T., IEEE EIDM Techn. Drg. 1983 p. 16. These methods rely on the use of polysilicon (polycrystalline silicon) base contacts and therefore two layers of polysilicon are required.

According to one aspect of the present invention there is provided a method of manufacturing a bipolar transistor including the steps of defining a polycrystalline silicon emitter mesa on an unoxidised surface of a base region disposed in a semiconductor substrate, oxidising side walls of the mesa and the exposed unoxidised surface of the base region, and implanting a base contact region into the substrate in contact with the base region using at least one oxidised side wall of the mesa as part of the implantation mask whereby the base contact region is self-aligned with the emitter.

According to another aspect of the present invention there is provided a bipolar transistor including a polycrystalline silicon emitter mesa in contact with a base region and including a base contact, the emitter having an oxidised sidewall which during manufacture of the transistor serves for self-alignment of the base contact.

Figure 7:
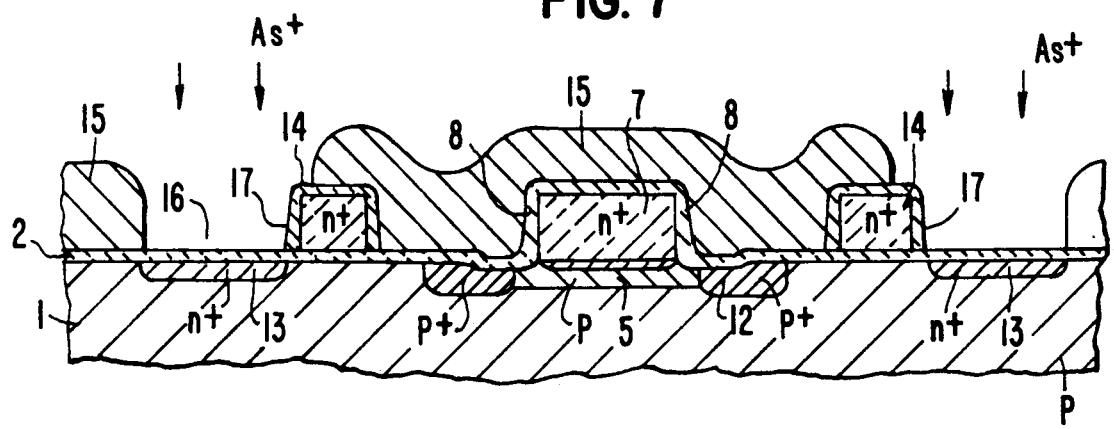

Embodiments of the present invention will now be described with reference to the accompanying drawings, in which:

FIGS. 1 to 6 illustrate, schematically and in cross-section, successive processing stages in the manufacture of self-aligned base contacts according to one embodiment of the present invention, and FIG. 7 illustrates a cross-section through a fully self-aligned polysilicon emitter bipolar transistor.

Figure 2:
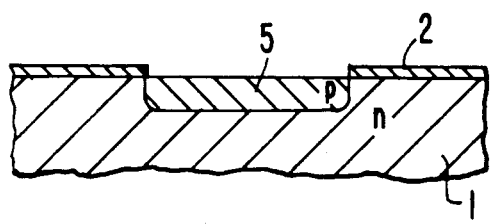
Figure 5:
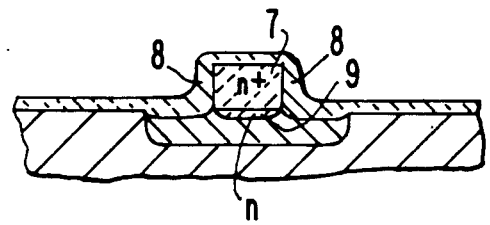
Figure 3:
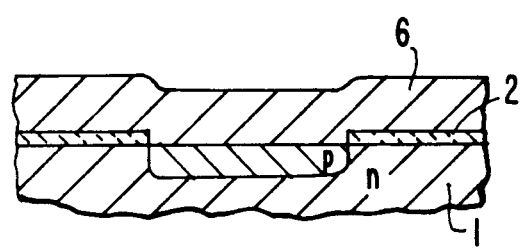
Figure 6:
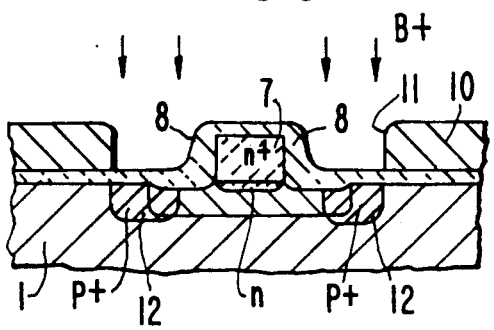

Referring firstly to FIGS. 1 to 6 the successive processing stages required to manufacture self-aligned base contacts will be described. A substrate 1 of n-type single crystal silicon is oxidised to provide a surface layer of silicon dioxide 2. A layer of photoresist 3 is applied and using a suitable mask (not shown) a window 4 is opened in the photoresist 3, which window 4 defines the base area (FIG. 1). Using ion implantation boron, for example, is implanted to produce a base 5. Following this implantation the oxide exposed through window 4 is etched using the base mask (photoresist 3) to define the area within which the emitter will be formed. The photoresist 3 is removed (FIG. 2). If a surface treatment is required to produce an interfacial oxide it can be used now. A layer of polysilicon 6 is then deposited (FIG. 3) and doped n+, for example with arsenic or phosphorus. Following definition of the emitter area the polysilicon 6 is dry etched to produce the structure of FIG. 4 with a substantially central n+ polysilicon mesa or emitter 7. The dry etch is controlled to give good anisotropy and high selectivity over the single crystal silicon substrate 1. We have demonstrated a selectivity of 10:1. For typical layer thickness and overetches this would lead to less than 500A (0.05 μm) of the base being consumed during the polysilicon etch process. The structure is then provided with oxide sidewall spacers 8 (FIG. 5). The spacers may be produced by, for example the oxidation method described in our co-pending application No. 8507600 (Ser. No. 2172743) (P. D. Scovell-R. L. Baker 14-6) or by using reactive ion etching (RIE) of a conformed deposited oxide. The method described in our copending Application involves the use of a silicon nitride capping layer on a polysilicon mesa (emitter) and oxidising the sidewalls of the mesa at a low temperature which is preferably below 900° C. in order to take full advantage of the differential oxidation ratio of polysilicon and single crystal silicon. As a result of this processing a n type region 9 is formed. The structure is then provided with a photoresist layer 10 (FIG. 6) which is patterned using a suitable mask (not shown) to provide a window 11 therein, that is to define a $p^{30}$ contact mask. A base contact implant of, for example, boron is performed to produce base contacts 12 which are self-aligned with the polysilicon emitter region 7 by virtue of using the polysilicon and sidewall spacers 8 as a part of the p+ contact mask. To complete a bipolar transistor from the structure of FIG. 6 a collector contact (not shown) to the substrate 1 is required together with suitable metallisation, for example, to provide external electrical contacts to the base and collector contacts and to the polysilicon emitter.

A section through a complete bipolar transistor is shown in FIG. 7. This transistor has collector contacts 13 which are aligned to the emitter edges by use of polysilicon stripes (alignment mesas) 14 defined in the same masking at etching sequence as the emitter mesa 7. The sidewalls 17 of the stripes 14 are also oxidised as those of the emitter 7. A photoresist layer 15 is applied and patterned using a mask not shown to provide windows 16 for implantation of arsenic, for example, for the collector contacts 13. The mask need only be a "sloppy" mask since the outermost oxidised edges of the stripes 14 define the edge of the collector contacts and photoresist is only required to protect areas into which collector contact material is not to be implanted. The edge of the polysilicon stripe defines the distance between the emitter edge and the collector contact. The device is thus fully self-aligned.

The self-alignment of the base contacts is thus achieved by a method which uses a single layer of polysilicon and sidewalls and is simplified in comparison with the method using two layers of polysilicon as required in the known methods referred to above.

We claim:

1. A method of manufacturing a bipolar transistor including the steps of defining a polycrystalline silicon mesa of one conductivity type on an unoxidised surface of a first monocrystalline region of the opposite conductivity type disposed in a monocrystalline silicon semiconductor substrate of the one conductivity type; performing an oxidation process to produce an oxide layer over the semiconductor substrate, part of which oxide layer extends over the mesa including the top and sidewalls thereof and part of which extends over adjoining portions of the semiconductor substrate; providing a photoresist layer over the oxide layer; patterning the photoresist layer to define one part of a two part contact region implementation mask, the other part of the mask being comprised by the part of the oxide layer on at least one sidewall of the mesa, and to remove the photoresist layer from said at least one sidewall, between which mask parts is defined a window for contact region implantation; subsequently implanting a contact region, of the opposite conductivity type, through the oxide layer exposed by said window and into the substrate in contact with the first region, the contact region being of monocrystalline silicon and being self-aligned with the mesa as a result of using the part of the oxide layer on the at least one sidewall of the mesa directly as part of the contact region implantation mask; and further including the step of removing the patterned photoresist layer.

2. A method as claimed in claim 1, wherein the first region is implanted into the substrate through another oxide layer disposed thereon via a window in a masking layer and wherein at least a part of the other oxide layer exposed by the window in the masking layer is subsequently removed.

3. A method as claimed in claim 2, wherein the mesa is defined from a layer of polycrystalline silicon deposited on the substrate subsequent to the removal of the at least a part of the other oxide layer exposed by the window in the masking layer.

4. A method as claimed in claim 3, wherein the mesa definition comprises appropriately masking the polycrystalline silicon layer and dry etching.

5. A method as claimed in claim 3, further including the step of defining a polycrystalline silicon contact alignment mesa from said layer of polycrystalline silicon simultaneously with said polycrystalline silicon mesa, the sidewalls and top of the alignment mesa being oxidised during said oxidation process.

* * * * *